United States Patent [19]
Edhlund

[11] 4,282,310
[45] Aug. 4, 1981

[54] METHOD OF MAKING PRESSURE-SENSITIVE TRANSFER SHEETS

[75] Inventor: Ronald D. Edhlund, Palatine, Ill.

[73] Assignee: American Photo-Graphics Corporation, Elk Grove Village, Ill.

[21] Appl. No.: 164,367

[22] Filed: Jun. 30, 1980

[51] Int. Cl.³ ............................................. G03C 1/76
[52] U.S. Cl. .................................. 430/309; 430/259; 430/271; 430/272; 430/273; 430/292; 430/293
[58] Field of Search ............... 430/271, 272, 273, 309, 430/293, 192, 259

[56] References Cited

U.S. PATENT DOCUMENTS

| | | | |
|---|---|---|---|
| 3,620,738 | 3/1968 | Wong | 430/293 |
| 3,721,557 | 3/1973 | Inoue | 430/293 |

*Primary Examiner*—Jack P. Brammer
*Attorney, Agent, or Firm*—George H. Gerstman

[57] ABSTRACT

A method for producing a pressure-sensitive dry transfer sheet. A release coating is applied to a base sheet and a pigmented ink is applied over the release coating. A photoresist is applied over the pigmented ink and selected portions of the photoresist are exposed to light. Portions of the photoresist and the pigmented ink that are not to be part of the transfer image are removed, and a pressure sensitive adhesive coating is applied.

7 Claims, 4 Drawing Figures

METHOD OF MAKING PRESSURE-SENSITIVE TRANSFER SHEETS

BACKGROUND OF THE INVENTION

This invention concerns a novel method for producing a pressure sensitive dry transfer sheet and a novel dry transfer sheet which is produced in accordance with the method.

Dry transfer sheets are widely used to transfer lettering or other images without requiring the use of a liquid to effect the transfer. Transfer sheets are placed against the surface on which the image is to be transferred and the image on the sheet can be transferred with an amount of burnishing.

Typically pressure sensitive transfer sheets are produced using a screen printing technique and in this manner, thousands of duplicate sheets can be made. Frequently, it is desirable to have only a small number of sheets containing a particular image to be transferred and the use of a screen printing technique for a very limited production of transfer sheets is inefficient. Further, the production of pressure sensitive transfer sheets using a screen printing technique for the printing of the image thereon is time-consuming and relatively expensive, particularly when the customer wishes to have a particular image on only a small number of transfer sheets.

It is, therefore, an object of the present invention to provide a method for producing a pressure sensitive transfer sheet which does not require screen printing techniques.

Another object of the present invention is to provide a method for producing a pressure sensitive transfer sheet that enables the production of a small amount of transfer sheets in a very short amount of time.

A further object of the present invention is to provide a method for producing pressure sensitive transfer sheets using photographic techniques in contrast to the use of screen printing techniques.

A still further object of the present invention is to provide a pressure sensitive transfer sheet that is simple in construction and is efficient to manufacture.

Other objects and advantages of the present invention will become apparent as the description proceeds.

SUMMARY OF THE INVENTION

In accordance with the present invention, a method is provided for producing a pressure sensitive dry transfer sheet. The method comprises the steps of first applying a release coating to a base sheet. A pigmented ink is then applied over the release coating and a photoresist coating is applied over the pigmented ink. Selected portions of the photoresist are exposed to light and portions of the photoresist and pigmented ink that are not to be part of the transfer image are removed. Thereafter, a pressure sensitive adhesive coating is provided over the transfer image.

In the illustrative embodiment, the step of applying a pigmented ink comprises the step of applying a water-insoluble type of pigmented ink and the step of applying the photoresist coating comprises the step of applying a water soluble photoresist. In this embodiment, after the selected portions of the photoresist have been exposed to light, water is introduced to remove portions of the photoresist that are not to be part of the transfer image and thereafter a solvent is introduced to remove portions of the pigmented ink that are not coated with photoresist and are not to be part of the transfer image.

In accordance with the present invention, a pressure sensitive dry transfer sheet is provided. The dry transfer sheet of the present invention comprises a base sheet having a release coating with a pigmented ink overlying the release coating. A photoresist overlies the pigmented ink and a pressure sensitive adhesive overlies the photoresist.

A more detailed explanation of the invention is provided in the following description and claims, and is illustrated in the accompanying drawings.

Figure 1:
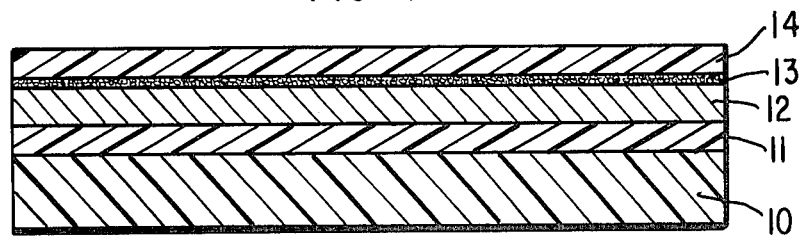
FIG. 1 is a diagramatic view of a cross section of a dry transfer sheet during its production, in accordance with the method of the present invention.
Figure 2:
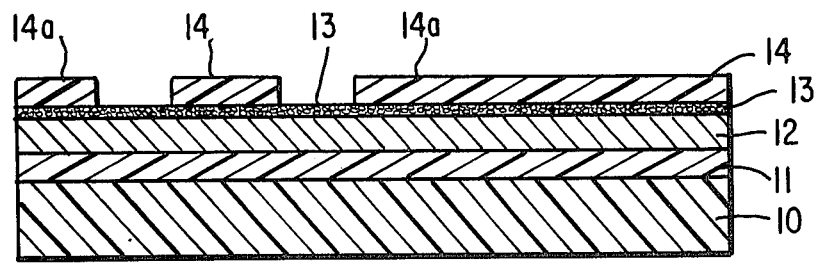
FIG. 2 is a diagramatic view similar to FIG. 1, but showing a subsequent stage of the method of the present invention.
Figure 3:
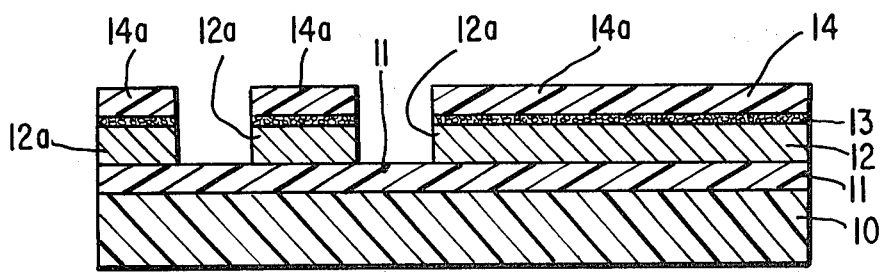
FIG. 3 is a diagramatic view similar to FIG. 1 but showing a further stage of the method of the present invention.

It is to be understood that the diagrams of FIGS. 1-4 are not to actual scale. The scale used is for diagram purposes only and for enabling complete understanding of the present invention.

DETAILED DESCRIPTION OF THE ILLUSTRATIVE EMBODIMENT

A pressure-sensitive dry transfer sheet is provided in accordance with the present invention, in the following manner. A base sheet 10 of flat, smooth material is first provided. The base sheet could comprise glassine, polyethylene, polypropylene, polyester, vinyl, polystyrene or any other suitable material. The base sheet is preferably 0.004 inch to 0.005 inch in thickness.

A silicone release coating 11 is applied to a surface of the base sheet 10, and a water insoluble, pigmented, lacquer-type ink coating 12 is applied over the silicone release coating 11 and allowed to dry. The pigmented ink 12 will contain the color pigments of the color that is to be transferred.

The ink surface is coated with finely-ground magnesium silicate powder 13. To this end, a sizing of the finely ground magnesium silicate powder 13 is rubbed over the entire surface of the dry ink 12. The powder reacts with a photoemulsion which will thereafter be applied, to form a mechanical bond with the ink 12.

A photoemulsion 14, such as a photoresist and of the type used to create screen printing stencils, is uniformly applied to the entire surface of the ink 12 which has been coated with powder 13, and is allowed to dry. The resulting structure is diagrammatically illustrated in FIG. 1 and comprises a base sheet 10, release coating 11 overlying the base sheet 10, pigmented ink 12 overlying the release coating 11, powder 13 overlying the pigmented ink 12 and photoresist coating 14 overlying the pigmented ink 12 and powder 13.

After the photoresist 14 is dried, a negative of the desired image is then placed in contact with photoresist 14. The photoresist is exposed to light, the negative is removed and the sheet is placed in a clamp on a flat, inclined plane, emulsion side up. The sheet is rinsed with water to remove the unexposed portion of the water soluble photoresist, resulting in the sheet illustrated in FIG. 2 with only exposed (hardened) portions 14a of the photoresist layer 14 remaining.

Figure 4:
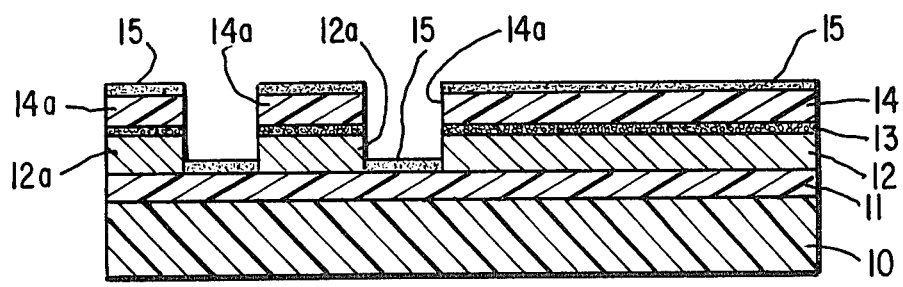
FIG. 4 is a diagramatic view similar to the view of FIG. 3, but showing a cross section of a pressure sensitive dry transfer sheet in completed form.

A pad saturated with a suitable solvent for the water insoluble ink is then wiped over the surface. The ink in the areas which are not covered by photoresist 14a is removed, leaving only the ink portions 12a which are coated with photoresist 12a. Thereafter, a low tack, pressure-sensitive adhesive 15 is applied over the entire surface and dried. The resulting sheet is illustrated in FIG. 4, and comprises a base sheet 10, release coating 11, pigmented ink portions 12a, powder 13 coating pigmented ink portions 12a, photoresist 14a coating ink portions 12a and pressure-sensitive adhesive 15 coating the surface of the sheet.

The images can then be transferred onto a desired surface by placing the sheet in contact with the surface with adhesive side 15 engaging the surface on which the image is to be transferred. The operator may then apply a burnishing tool against base sheet 10 to transfer the image from the dry transfer sheet to the surface.

As a first example, a base sheet 10 of polystyrene was coated with Dow Corning Syl-Off 23 silicone coating 11 and dried. A layer of pigmented ink 12, in this example a lacquer type ink known as DLW Series from Advance Process Supply, Chicago, Illinois, was applied and dried. A coating 13 of magnesium silicate was then spread over the entire surface of the dried ink layer 12. A coating of photoemulsion 14, in this example Ulano Fotocoat 449, sold by Ulano, Brooklyn, New York, sensitized with ammonium dichromate, was applied and dried. A film negative of the desired image was then placed in intimate contact with the dried photoemulsion 14 and exposed to actinic light. After exposure, the film negative was removed and the photoemulsion 14 was flushed with water, washing off the unexposed portion and leaving a hardened, insoluble image from the negative on the ink surface 12. A strip of polyether foam was saturated with xylene and wiped across the ink surface 12, removing the ink that was not covered by the hardened photoemulsion 14. A coating of pressure-sensitive adhesive 15 was applied to the entire surface and dried. The sheet was then turned over and placed, adhesive side down, onto a sheet of paper. The sheet was then burnished in the image areas, transferring the image onto the sheet of paper.

As a second example, the same process as Example 1 was used, but the base sheet 10 was formed of glassine and coating 11 was General Electric SS 4191 silicone coating. The pigmented ink was a polyamide type flexographic ink known as Flexogloss from General Printing Ink, Chicago, Illinois. Photoemulsion 14 was Ulano Fotocoat 771, sensitized with diazo resin. To remove the ink that was not covered by the hardened photoemulsion, a strip of polyether foam was saturated with a blend of isopropyl alcohol and naptha.

In a third example, the identical process as set forth in Example 1, was used except that the base sheet 10 was formed of clear polyester instead of polystyrene.

It is seen that a novel method has been described for producing pressure-sensitive dry transfer sheets using a photographic technique in contrast to a screen printing technique, thereby allowing the efficient production of a small number of dry transfer sheets. Although an illustrative embodiment of the invention has been shown and described, it is to be understood that various modifications and substitutions may be made by those skilled in the art without departing from the novel spirit and scope of the present invention.

What is claimed is:

1. A method for producing a pressure sensitive dry transfer sheet which comprises the steps of:
   applying a release coating to a base sheet;
   applying a pigmented ink over the release coating;
   applying a photoresist coating over the pigmented ink;
   exposing to light only selected portions of the photoresist;
   removing the portions of the photoresist and the pigmented ink that are not to be part of the transfer image; and
   applying a pressure-sensitive adhesive coating over the transfer image.

2. A method as described in claim 1, wherein the step of applying a release coating comprises the application of a silicone release coating.

3. A method as described in claim 1, wherein the step of applying a pigmented ink comprises the step of applying a lacquer-type pigmented ink that is water insoluble.

4. A method as described in claim 1, including the step of applying a finely-ground powder directly over the pigmented ink prior to the application of the photoresist coating.

5. A method as described in claim 3, wherein the step of applying a photoresist coating comprises the step of applying a water-soluble photoresist.

6. A method for producing a pressure-sensitive dry transfer sheet which comprises the steps of:
   applying a release coating to a base sheet;
   applying a water-insoluble pigmented ink over the release coating;
   applying a water-soluble photoresist coating over the water-insoluble pigmented ink;
   exposing to light only selected portions of the water-soluble photoresist;
   introducing water to remove portions of the water-soluble photoresist that are not to be part of the transfer image;
   introducing a pigmented ink solvent fluid and removing the portions of the pigmented ink that are not covered by photoresist and are not to be part of the transfer image; and
   applying a pressure sensitive adhesive coating over the transfer image.

7. A method as described in claim 6, wherein the step of applying a release coating comprises the application of a silicone release coating and further including the step of applying a finely-ground powder directly over the pigmented ink prior to the application of the photoresist coating.

* * * * *